United States Patent [19]

Liu et al.

[11] Patent Number: 4,988,284
[45] Date of Patent: Jan. 29, 1991

[54] METHOD FOR COMPENSATING FOR THE E-BEAM PROXIMITY EFFECT

[75] Inventors: Hua-yu Liu, Palo Alto; En-Den D. Liu, Mountain View, both of Calif.

[73] Assignee: Hewlett-Packard Company, Palo Alto, Calif.

[21] Appl. No.: 916,662

[22] Filed: Oct. 8, 1986

[51] Int. Cl.$^5$ ............................ G03F 7/26; G03F 7/38
[52] U.S. Cl. .................................... 430/296; 430/311; 430/325; 430/326; 430/330
[58] Field of Search ............... 430/296, 311, 330, 942, 430/325, 326; 250/492.3

[56] References Cited

U.S. PATENT DOCUMENTS

| 4,929,536 | 5/1990 | Spak et al. | 430/325 |
| 4,931,381 | 6/1990 | Spak et al. | 430/325 |

OTHER PUBLICATIONS

Spak et al., "Mechanism and Lithographic Evaluation of Image Reversal in AZ5214 Photoresist", Conf. Proceedings: Polymers, Principles, Processing and Materials, American Chem. Soc., Allenville, N.Y., pp. 247–269, Oct. 28, 1985.
Broyde, "Exposure of Photoresist", J. Electrochemical Soc.: Solid State Science, vol. 117(12), Dec., 1970, pp. 1555–1556.
"Reduction of Photoresist Standing-Wave Effects by Post-Exposure Bake", by Edward John Walker; IEEE Transactions on Electron Devices; Jul., 1975; pp. 464–466.
"Monomer Redistribution in Dry-Developed X-Ray Resists", by Vladimir Starov; Varion Associates, Inc., J. Image Science, vol. 30(2), Mar.-Apr., 1986, pp. 74–79.
"Application of GHOST Proximity Effect Correction Method to Conventional and Nonswelling Negative E-Beam Resists"; Huy-yu Liu and E. D. Liu; SPIE vol. 632.
Electron-Beam, X-Ray & Ion-Beam Techniques for Submicrometer Lithographies V (1986); pp. 244–249.
"Proximity Effect Correction for Electron Beam Lithography by Equalization of Background Dose", by Geraint Owen and Paul Rissman; vol. 54, Jun., 1983; No. 6; American Institute of Physics; pp. 3573–3581.
"Proximity Effect Correction in Electron-Beam Lithography", by N. D. Wittels and C. I. Youngman; Sperry Research Center, Sudbury, Mass.; pp. 361–367.
"Corrections to Proximity Effects in Electron Beam Lithography", by Mihir Parikh; J. Appl. Phys. 50(6), Jun., 1979, 0021-8979/79/064371 071; 1979 Am. Inst. of Physics; pp. 4371–4377.

Primary Examiner—Jose G. Dees

[57] ABSTRACT

A method to compensate for the E-beam proximity effect which includes a post exposure, pre-development baking of the photoresist layer. The baking of the photoresist layer causes a migration of small, photo-active compound (PAC) molecules to increase the size of peripheral exposed areas so as to compensate for the exposure size variations caused by the proximity effect.

9 Claims, 1 Drawing Sheet

METHOD FOR COMPENSATING FOR THE E-BEAM PROXIMITY EFFECT

BACKGROUND OF THE INVENTION

1. Field of the Invention

This invention relates generally to methods for producing integrated circuits, and more particularly to methods for compensating for the E-beam proximity effect.

2. Description of the Prior Art

An integrated circuit comprising many hundreds or thousands of individual components is typically formed on a semiconductor substrate, such as a wafer of silicon. To produce integrated circuits, patterned layers of semiconducting, insulating, and conducting materials are sequentially provided over the surface of the substrate until the desired circuits are completed.

A typical method for patterning a layer of an integrated circuit is to apply a reactive material to an upper surface of the substrate, expose the reactive material to a source of radiant energy, and to develop the reactive material to produce a "mask" over the surface of the substrate. The layer is then patterned through the mask and the mask is subsequently removed. The process for forming the mask is often referred to as lithography.

Most often, the radiant energy to which the reactive material is exposed is electromagnetic radiation in the visible or ultraviolet range, the reactive material is photoresist, and the process is referred to as photolithography. However, as the size of integrated circuits decrease the relatively long wavelengths of visible and ultraviolet light become a limiting factor in the possible feature resolution of the mask. In consequence, there is considerable interest in utilizing radiant energy of shorter wavelengths to expose the reactive layers. One type of radiant energy which shows great promise in lithography comprises a beam of electrons, or E-beam.

While the E-beam lithography process is capable of superior feature resolution, the process also has its share of problems and disadvantages. One problem of major concern with E-beam lithography is the so-called "proximity effect".

Briefly, the E-beam proximity effect is caused by the back-scattering of electrons as the E-beam impacts the reactive layer, underlying layers, and the substrate. The back-scattering increases the effective exposure of portions of the reactive layer, causing undesirable variations in feature sizes. While the E-beam proximity effect is not particularly troublesome in widely separated features, it can cause considerable variation in the sizes of closely-packed features, such as those found in grating patterns.

There have been many proposed correction techniques for the E-beam proximity effect. One such method is described by Owen, et al., in "Proximity Effect Correction for Electron Beam Lithography by Equalization of Background Dose", Journal of Applied Physics, Vol. 54, No. 6, June, 1983. The Owen, et al. correction method, which is named "Ghost", involves first exposing the image area in a traditional manner, and then exposing the field area with a de-focused beam at a lower dose to compensate for the back-scattered electron energy. In consequence, all of the image areas receive the same level of energy, and the background energies in the field are equalized. However, the ghost method requires an additional field exposure, and results in lower image contrast.

The proximity effect can be compensated for by several other methods, including the adjustment of the exposure dose for each subdivided shape, and the adjustment of the size of the design pattern. Parkah, in the Journal of Applied Physics, Vol. 50, No. 6, Page 4371 (1979), teaches the former method; and Wittels, et al., Electron and Ion Beam Science and Technology, Electrochemical Society (1978), teaches the latter method. Unfortunately, both methods require massive computer and manual calculations of such factors as local exposure doses, and the size, shapes, and geometries of adjoining features and spaces. These calculations tend to be very expensive and time consuming.

SUMMARY OF THE INVENTION

An object of this invention is to provide a simple, economical method for compensating for the E-beam proximity effect. Briefly, the method includes the steps of applying a reactive material to a substrate; drying the reactive material to form a reactive layer; exposing portions of the reactive layer with an E-beam; baking the reactive layer to cause a molecular migration from unexposed portions to exposed portions of the reactive layer; and developing the reactive layer. The molecular migration caused by the post exposure bake tends to compensate for the E-beam proximity effect.

An advantage of the method of the present invention is its simplicity. The troublesome E-beam proximity effect can be compensated for by the proper choice of reactive material and by a post-exposure bake.

Another advantage of the method of the present invention is that the E-beam proximity effect can be fully compensated for without apparent loss of resolution.

These and other objects and advantages of the present invention will be apparent to those skilled in the art after reading the following descriptions and studying the various figures of the drawing.

DETAILED DESCRIPTION OF THE PREFERRED EMBODIMENT

Figure 1:
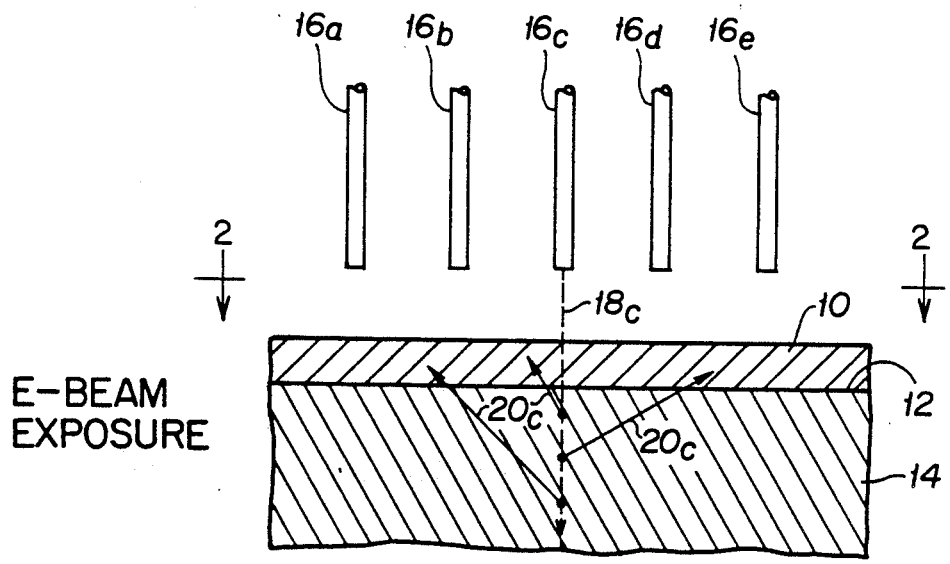
FIG. 1 is a partial, cross-sectional view illustrating the E-beam exposure of a reactive layer covering a semiconductor substrate.

With reference to FIG. 1, a reactive layer 10 is formed over the upper surface 12 of a semiconductor substrate 14. Typically, the reactive layer 10 is formed by pouring liquid reactive material (such as photoresist) onto the upper surface 12 as the substrate 14 is rapidly rotated, and then "curing" the reactive material by a suitable process such as baking the substrate 14 in an oven. The methods for applying photoresist to semiconductor substrates are well-known to those skilled in the art. It should be noted that reactive layers can also be formed over other layers which are, in turn, formed over the substrate.

Lines 16a, 16b, 16c, 16d, and 16e represent the E-beam as it is scanned across the surface of reactive layer 10 by an E-beam lithography machine. The path 18c along which E-beam line 16c travels goes through the reactive layer 10 and into the substrate 14. The other E-beam lines similarly penetrate into the reactive layer and the substrate. As the E-beam impacts atoms within the reactive layer and within the crystal structure of substrate 14, a certain percentage of electrons are back-scattered to the reactive layer 10 as suggested by broken lines 20c. It is these back-scattered electrons which are the major cause of the aforementioned the E-beam proximity effect.

Figure 2A:
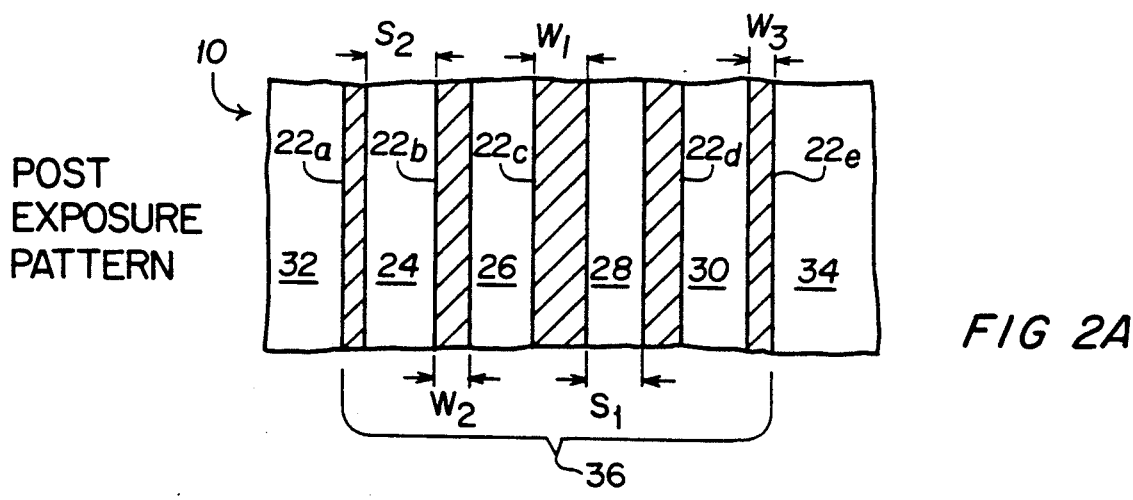
FIG. 2a is a top plan view taken along line 2—2 of FIG. 1 illustrating an exposure pattern formed in the reactive layer cause by the E-beam.

In FIG. 2a, it can be seen that the exposed portions 22a, 22b, 22c, 22d, and 22e, result in different widths even though their exposure energies from E-beam lines 16a-16e, respectively, were of the same energy level. More specifically, the central exposed area, 22c, is of a width $W_1$, the two exposed areas 22b and 22d are of lesser width $W_2$, and the outside exposed area 22a and 22e are of a still lesser width of $W_3$. In consequence, the unexposed areas 24, 26, 28, and 30 between the exposed areas 22a-22e also vary in width. For example, unexposed area 26 and 28 have a width of $S_1$, while the unexposed areas 24 and 30 have a width of $S_2$. The unexposed areas 32 and 34 are perimeter areas surrounding the grating pattern 36 formed by the exposed areas 22a-22e.

The reason why exposed area 22c is of the greatest width is that it receives more back-scattered electrons and thus more background energy than the other exposed areas. Likewise, exposed areas 22b and 22d are wider than exposed areas 22a and 22e, because they receive more back-scattered background energy. In general, the exposed regions near the center of a grating pattern will be larger than those near the edges of the pattern, even though they have received the same amount of direct exposure energy.

Figure 2B:
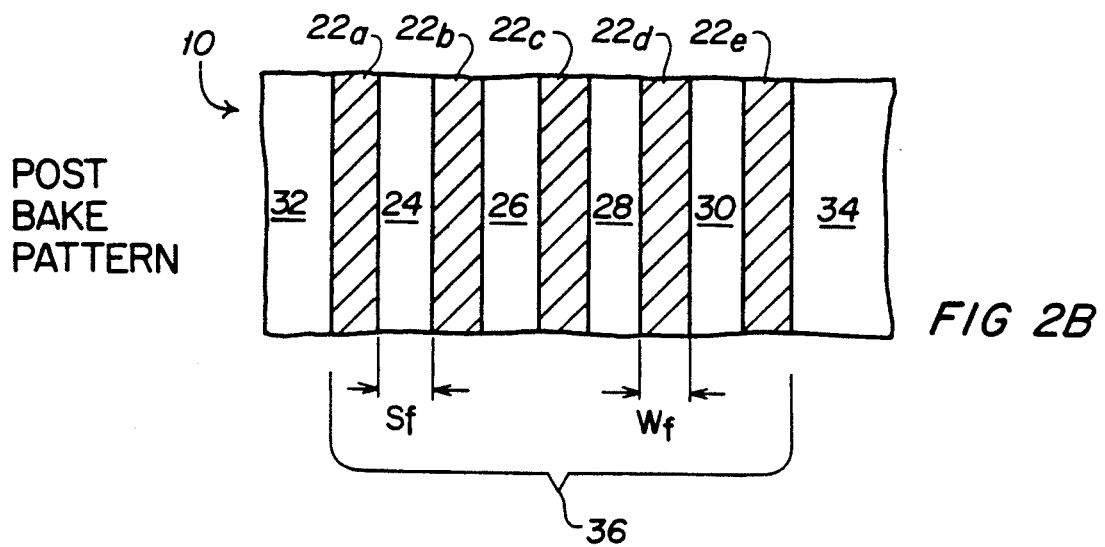
FIG. 2b is a top plan view taken along line 2—2 of FIG. 1 illustrating the the change to the exposure pattern caused by the post-exposure bake.

Referring now to FIG. 2b, the exposed areas 22a-22e are illustrated after the post-exposure bake. As can be seen, the exposed areas 22a-22e have substantially the same width $W_f$, and the unexposed area 24-30 have substantially the same width $S_f$. This is due to a molecular migration from the unexposed area 24-34 into the exposed area 22a-22e caused by the post-exposure bake.

Exposed areas 22a and 22i e grow more than the remaining exposed area because they are surrounded by more unexposed area, and therefore are adjacent to a larger supply of molecules that are capable of migration. Likewise, exposed areas 22b and 22d grow more than exposed area 22c because they are surrounded by more unexposed area than is exposed area 22c. Therefore, in general, the molecular migration caused by a post-exposure bake causes exposed area near the edges of a grating pattern 36 to grow more than exposed area towards the center of the grating pattern.

It should be noted that the diffusion or molecular migration effect caused by a post-exposure bake is precisely opposite to the E-beam proximity effect. Therefore, by carefully controlling the characteristics of the reactive layer and the parameters of the post-exposure bake, the molecular migration effect can be used to compensate for the E-beam proximity effect.

The method of the present invention has been demonstrated to be effective when using AZ-5214 photoresist produced by AZ photo Products of Sunnyvale, Calif. to form the reactive layer. AZ-5214 is nominally a positive photoresist, which undergoes an image-reversal reaction during the post-exposure bake to become a negative photoresist. This image reversal phenomenon is described in "Mechanism and Lithographic Evaluation of Image Reversal in AZ-5214 Photoresist", by Soak et al., American Hoechst Corporation, AZ Photoresist Products Group, Sunnyvale, Calif.

In the process of the present invention, the AZ-5214 photoresist was conventionally applied to a silicon wafer, and was then exposed by a vector-scan, variable-shape, E-beam JEOL JBX6AII system at an exposure intensity of 50 micro-coulombs/$cm^2$ at an accelerating voltage of 20 Kev. The exposed wafer was then baked in an ambient atmosphere oven for thirty minutes at temperatures from 100° C. to 140° C. A metal ion free developer from AZ Products was used to develop the image-reversed photoresist to produce the desired mask.

The completed mask showed a material build-up at the edges of exposed areas, and substantial line width increases in isolated features. It appears that the molecular migration effect is a multiple function of exposure dose, post-exposure bake temperature, and post-exposure bake time.

It is believed that the observed molecular migration is the result of diffusion of small, mobile molecules along a concentration gradient created between the exposed and non-exposed areas by the conversion of the mobile molecules in the exposed areas into larger, relatively immobile polymers. Such diffusion has been observed before under other circumstances. See, for example, Walker "Reduction of Photoresist Standing Wave Effects by Post-Exposure Bake", IEEE Transactions on Electron Devices, July 1975, page 464, and Starove, "Monomer Redistribution in Dry Developed X-Ray Resist", Varian Associates, Inc.

Apparently, upon exposure, photo-active compounds (PAC) are chemically degraded to form carboxylic acids, which catalyze cross-linking reactions between Novolac resin molecules during the post-exposure bake step. A PAC concentration gradient is thereby established across interface between the exposed and unexposed regions of the photoresist. Since the PAC (Mw =500) is much smaller in size than the Novolac resin (Mw =2,000 to 50,000), the PAC molecules have much higher mobility. It is therefore assumed that the PAC molecules are the small, mobile molecules which are moving from the unexposed to the exposed regions of the photoresist during the post-exposure bake.

It should be noted that many publications describe the details of common techniques used in the fabrication process of integrated circuit components. See, for example, *Semiconductor and Integrated Circuit Fabrication Techniques,* published by Preston Publishing Co., Inc. These techniques can be generally employed in the fabrication of the structures of the present invention. Moreover, the individual manufacturing steps can be performed using commercially available integrated circuit fabrication machines. As specifically necessary to an understanding of the present invention, approximate technical data for the preferred embodiments are set forth based upon current technology. Future developments in this art may call for appropriate adjustments, as would be obvious to one skilled in the art.

While this invention has been described with reference to a particular, preferred embodiment, it is contemplated that various alterations and permutations of the invention will become apparent to those skilled in the art upon a reading of the preceding descriptions and a study of the drawing. It is therefore intended that the scope of the present invention be determined by the following appended claims.

What is claimed is:

1. A method which helps compensate for the E-beam proximity effect during the production of a mask for a semiconductor substrate comprising the steps of:

forming a reactive layer over a semiconductor substrate;

exposing portions of said reactive layer with an electron beam to produce exposed portions, whereby the resultant dimensions of said exposed portions are dependent, at least in part, to their relative proximity to adjacent exposed portions due to the E-beam proximity effect;

causing a molecular migration within said reactive layer from unexposed portions thereof to adjacent exposed portions thereof, whereby the magnitude of said molecular migration to a particular exposed portion is inversely related to the magnitude of the E-beam proximity effect on that particular exposed portion, thereby at least partially compensating for the effects of said E-beam proximity effect; and developing said reactive layer.

2. A method for producing a mask as recited in claim 1 wherein said step of forming a reactive layer comprises:

applying a reactive material to an upper surface of said substrate; and curing said reactive material.

3. A method for producing a mask as recited in claim 1 wherein said step of causing a molecular migration within said reactive layer comprises elevating the temperature of said reactive layer for a period of time.

4. A method for producing a mask as recited in claim 3 wherein said temperature of said reactive layer is raised to at least 100° C.

5. A method for producing a mask as recited in claim 5 wherein said period of time is at least 30 minutes.

6. A method for at least partially compensating for the E-beam proximity effect comprising the steps of:

applying a material having small, mobile photo-sensitizer molecules suspended in a polymer solution to a support surface;

curing said material to for a reactive layer over said support surface;

exposing portions of said reactive layer with an E-beam, whereby the resultant dimensions of said exposed portions are dependent, at least in part, to their relative proximity to adjacent exposed portions due to the E-beam proximity effect;

baking said reactive layer to cause some of said photo-sensitizer molecules to migrate from unexposed portions to adjacent exposed portions of said reactive layer in substantially the inverse proportion to the degree that said exposed portions had been affected by said E-beam proximity effect; and developing said reactive layer.

7. A method for producing a mask as recited in claim 6 wherein said step of baking said reactive layer has the additional effect of converting said reactive layer from a positive reactive layer to a negative reactive layer.

8. A method for producing a mask as recited in claim 6 wherein said step of baking said reactive layer comprises heating said reactive layer to at least 100° C.

9. A method for producing a mask as recited in claim 6 wherein said reactive layer is baked for at least 30 minutes.

* * * * *